(12) United States Patent
Gough

(10) Patent No.: US 9,337,887 B2
(45) Date of Patent: May 10, 2016

(54) PHASE-ALIGNMENT BETWEEN CLOCK SIGNALS

(71) Applicant: u-blox AG, Thalwil (CH)

(72) Inventor: Andrew Gough, Reigate (GB)

(73) Assignee: u-blox AG, Thalwil (CH)

( * ) Notice: Subject to any disclaimer, the term of this patent is extended or adjusted under 35 U.S.C. 154(b) by 0 days.

(21) Appl. No.: 14/535,275

(22) Filed: Nov. 6, 2014

(65) Prior Publication Data

US 2015/0131706 A1  May 14, 2015

(30) Foreign Application Priority Data

Nov. 8, 2013 (EP) .................................... 13192175

(51) Int. Cl.
*H04B 1/24* (2006.01)
*H04B 1/7073* (2011.01)
*H03K 5/26* (2006.01)
*G01S 19/35* (2010.01)

(52) U.S. Cl.
CPC .............. *H04B 1/7073* (2013.01); *G01S 19/35* (2013.01); *H03K 5/26* (2013.01)

(58) Field of Classification Search
CPC ........................................................ H04D 3/24
See application file for complete search history.

(56) References Cited

U.S. PATENT DOCUMENTS

| 6,441,601 | B1 * | 8/2002 | Clark | ..................... G01R 25/00 324/76.52 |
| 2006/0114032 | A1 * | 6/2006 | Geer | .................. G01R 23/0005 327/12 |
| 2008/0118017 | A1 * | 5/2008 | Su | ............................. G06F 1/12 375/376 |

\* cited by examiner

*Primary Examiner* — Jaison Joseph
(74) *Attorney, Agent, or Firm* — Blakely Sokoloff Taylor & Zafman LLP

(57) ABSTRACT

There is proposed a method and system for determining a phase-alignment between first and second clock signals of differing frequency. The method comprise: sampling a value of the first clock signal at instants defined by an edge of the second clock signal; defining a sequence of the sampled values of the first clock signal, wherein consecutive sample values in the sequence are separated by N cycles of the second clock signal, and wherein N is an integer greater than 1; and detecting the occurrence of a predetermined pattern of values in the defined sequence.

20 Claims, 9 Drawing Sheets

| Edge No. | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|---|---|
| Phase [°] | 0 | 195 | 30 | 225 | 60 | 255 | 90 | 285 | 120 | 315 | 150 | 345 | 180 | 15 | 210 | 45 | 240 | 75 | 270 | 105 | 300 | 135 | 330 | 165 |
| Sampled Value | 1 | 0 | 1 | 0 | 1 | 0 | 1 | 0 | 1 | 0 | 1 | 0 | 0 | 1 | 0 | 1 | 0 | 1 | 0 | 1 | 0 | 1 | 0 | 1 |

Figure 3

| Edge No. | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 |
|---|---|---|---|---|---|---|---|---|---|---|---|---|---|---|---|---|---|---|---|---|---|---|---|---|---|
| Phase [°] | 0 | 230.4 | 100.8 | 331.2 | 201.6 | 72 | 302.4 | 172.8 | 43.2 | 273.6 | 144 | 14.4 | 244.8 | 115.2 | 345.6 | 216 | 86.4 | 316.8 | 187.2 | 57.6 | 288 | 158.4 | 28.8 | 259.2 | 129.6 |
| Sampled Value | 0 | 1 | 0 | 0 | 0 | 1 | 0 | 1 | 1 | 0 | 1 | 1 | 0 | 1 | 0 | 0 | 1 | 0 | 0 | 1 | 0 | 1 | 1 | 0 | 1 |

FIG. 5

| Edge No. | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|---|---|
| Phase [°] | 0 | 15 | 30 | 45 | 60 | 75 | 90 | 105 | 120 | 135 | 150 | 165 | 180 | 195 | 210 | 225 | 240 | 255 | 270 | 285 | 300 | 315 | 330 | 345 |
| Sampled Value | 1 | 1 | 1 | 1 | 1 | 1 | 1 | 1 | 1 | 1 | 1 | 1 | 0 | 0 | 0 | 0 | 0 | 0 | 0 | 0 | 0 | 0 | 0 | 0 |

FIG. 6

PHASE-ALIGNMENT BETWEEN CLOCK SIGNALS

FIELD OF THE INVENTION

This invention relates to the general field of clock signals for electronic signals and, more particularly, to determining phase-alignment between first and second clock signals of differing frequency.

BACKGROUND

In systems employing multiple clock signals, it is often necessary to be able to detect when two clocks bear a certain phase relationship, i.e. a certain phase-alignment with respect to one another. There are well known techniques in the art for accomplishing this, and these techniques usually provide a high-degree of accuracy. However, such techniques typically involve sophisticated hardware.

Sometimes, phase-alignment, or the detection of phase-alignment, between two different clock clocks signals may be required after a system has been implemented. In such situations, it is too late for an integrated hardware solution, although one could possibly incorporate external circuitry to detect clock-signal alignment according to known methods. This is undesirable from an integration and robustness point of view, and furthermore increases the cost of a system.

In Global Navigation Satellite System (GNSS) timing products, the precise synchronisation capability of a GNSS receiver is used to generate a timing signal which can be used in timing applications. This signal may be a 'Pulse per Second' (PPS) signal which, as the name implies, is a 1 Hz signal that is output by the GNSS receiver and is synchronized to UTC second rollover via transmissions received from GNSS satellites. Alternatively, it is known to use a 1 kHz signal or an 'Even Second' signal (which is 0.5 Hz but specifically uses evenly numbered seconds).

This pulse by itself is usually not enough to synchronize user equipment. The pulse indicates when the second rollover occurred, but it gives no information of what the actual time was or is. Thus, the timing signal is typically accompanied with a serial message defining the time of day, day of year and other parameters. With this additional information, the timing signal can be used in precise timing applications.

In a typical timing application, the GNSS receiver will be configured to dispatch the timing and serial signal for synchronisation, as shown in FIG. 1. The customer will normally want to clock the whole system from a single clock source, for example the reference or system clock. This usually presents no problems, as long as the timing signal itself is generated directly from the reference clock.

However, in some receivers, the timing signal is not generated directly from the reference clock REF_CLK, but rather from an internal clock CLK2 as shown in FIG. 1. This internal clock CLK2 may not be running at the same frequency as the reference clock REF_CLK. For example, the reference clock might be 26 MHz, whereas the internal clock might be 48 MHz. Consequently, the timing signal is not synchronous to the reference clock, and this can present several problems, including the following:

The time at which the timing signal is used by the customer will be the next 26 MHz edge after the timing signal arises. This effectively adds a 26 MHz saw-tooth error to the timing signal;

The input of the system clocked off the 26 MHz reference clock REF_CLK may measure the timing signal as a metastable event, since the edge is not synchronous to its clock. Correcting for this may take several clock cycles, and hence an even larger timing error. Further, if the timing pulse is short, then this may prevent it from being observed at all.

The system will often require an exact number of clock cycles between the timing events (26,000,000 of them for a 26 MHz case using a PPS signal). If the timing signal is not synchronous to the 26 MHz clock, then this can't be guaranteed.

BRIEF SUMMARY OF THE INVENTION

There is proposed a method and system for detecting the phase relationship or alignment between two different clock signals, wherein one clock signal is used to sample the other clock signal and the sample values are used to determine when a particular phase-relationship or alignment between the two clock signals occurs. Embodiments may therefore be used to identify when two clock signals are aligned (such that the rising edge of each clock signal occurs at substantially the same time for example) or bear a certain phase relationship with respect to one another.

By analysing the sampled values of the first clock signal, wherein the sampled values are obtained at instants defined by the second clock signal, a particular alignment between the two clock signals may be identified by detecting the occurrence of a predetermined pattern of values in the samples values.

Embodiments may be employed in existing systems without requiring additional and/or external circuitry. For example, an embodiment may be employed in software and/or make use of the existing hardware of a system. The requirement of additional hardware or circuitry may therefore be reduced. Also, customisation or modification of embodiments may be catered for to accommodate different scenarios. Some embodiments may even be entirely implemented in software (for example, as a computer program which can be loaded onto an existing multi-clock system).

According to an aspect of the invention, there is provided a method of determining a phase-alignment between first and second clock signals of differing frequency, the method comprising the steps of: sampling a value of the first clock signal at instants defined by an edge of the second clock signal; defining a sequence of the sampled values of the first clock signal, wherein consecutive sample values in the sequence are separated by N cycles of the second clock signal, and wherein N is an integer greater than 1; detecting the occurrence of a predetermined pattern of values in the defined sequence; and determining a phase-alignment between the first and second clock signals based on the detected occurrence of the predetermined pattern.

The step of sampling the first clock signal may comprise sampling a value of the first clock signal every N cycles of the second clock signal (where N is an integer greater than 1). In other words, the first clock signal may not be sampled at every rising edge of the second clock signal, but instead may be sampled at every Nth rising edge (where N is an integer greater than 1). In this way, the first clock signal may be sampled at regular time intervals such that the sampling frequency is equal to the frequency of the second clock signal divided by N (where N is an integer greater than 1).

Alternatively, the step of sampling the first clock signal may comprise sampling a value of the first clock signal every cycle of the second clock signal, but only a subset of the sampled values used to create the sequence of samples of the first clock signal. In other words, the first clock signal may be sampled at every rising edge of the second clock signal, and then a sequence of samples formed by selecting every Nth sample (where N is an integer greater than 1). In this way, the first clock signal may be sampled at the frequency of the second clock signal (for ease of implementation for example), but only a subset of the sampled values used to form the sequence of samples.

Due to the differing frequencies of the first and second clock signals, the phase-alignment between the first and second clock signals may change by a delta amount during N cycles of the second clock signal. N may be selected such that the delta amount (i.e. the change in phase-alignment) is less than or equal to 255°, preferably less than or equal to 225°, more preferably less than or equal to 195°, even more preferably less than or equal to 165°, more preferably less than or equal to 30°, more preferably less than or equal to 90°, and even more preferably less than or equal to 15°. In other words, N may be selected such that the change in phase-alignment (i.e. the delta amount) between the first and second clock signals during N cycles is a minimum non-zero value that is obtainable for the first and second clock signals (and this may, in turn, be determined by the frequencies of the first and second clock signals).

The predetermined pattern of values may comprise two consecutive sample values of the sequence of opposing value which indicate that the first and second clock signals are 0° or 180° degrees out of phase.

In other embodiments, the predetermined pattern of values may comprise three consecutive sample values of the sequence, the first and second consecutive sample values being of opposing value and the third consecutive sample value being equal to the second consecutive sample value.

Other embodiments may employ other predetermined patterns, wherein the predetermined depends on the change in phase-alignment between the first and second clock signals during N cycles.

Embodiments may be employed to iteratively determine a phase-alignment between first and second clock signals of differing frequency. A first estimate of phase-alignment between the first and second clock signals may be obtained by selecting N to be first value which results in the phase-alignment between the first and second clock signals changing by a first delta amount during N cycles of the second clock signal. A second, improved estimate of phase-alignment may then be obtained by selecting N to be second value which results in the phase-alignment between the first and second clock signals changing by a second, smaller delta amount during N cycles of the second clock signal. In this way, a first, coarse estimate of phase-alignment may be obtained quickly, and then a second, more accurate estimate of phase-alignment may be obtained afterwards.

BRIEF DESCRIPTION OF THE DRAWINGS

Preferred embodiments of the present invention will now be described, by way of example only, with reference to the following drawings in which:

FIG. 3 shows a table of the phase differences and corresponding sampled values of the reference clock of FIG. 2 measured at rising edges of the internal sampling clock of FIG. 2;

FIG. 5 shows a table of the phase differences and corresponding sampled values of the reference clock of FIG. 4 measured at rising edges of the internal sampling clock of FIG. 4;

FIG. 6 shows a table of the phase differences and corresponding sampled values of a reference clock of 26 MHz measured at rising edges of an internal sampling clock of 48 MHZ;

DETAILED DESCRIPTION OF THE EMBODIMENTS

Figure 1:
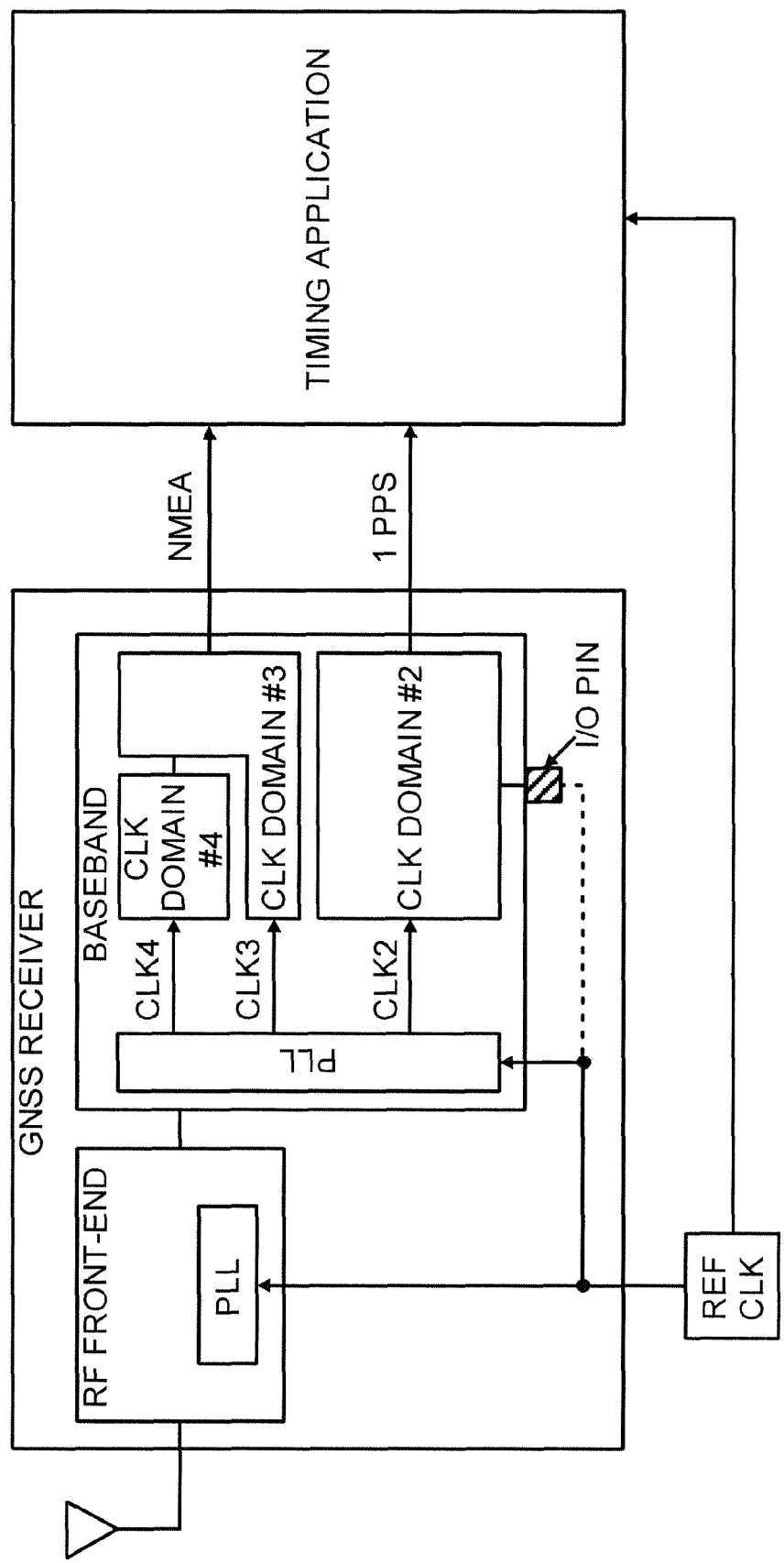
FIG. 1 is a schematic block diagram of a GNSS receiver with an associated timing application.

A simple technique to detect when two clocks of differing frequency are in phase-alignment (or bear a particular phase relationship with respect to one another) is presented. The technique may be predominantly software-based, in which case it may only require only one extra (or a spare) I/O pin to be implemented.

The idea is to sample a first clock signal (e.g. REF_CLK) using a second clock signal (e.g. CLK2). This sampling operation will generally produce either a logical one ("1") or logical zero ("0"), depending on the phase relationship between the two clock signals. Thus, using one of the clock signals to sample the other will generate a stream of consecutive logic values, and the pattern of values will be dictated by the phase relationship between the two clock signals.

If one assumes that the first clock signal (e.g. REF_CLK) (in other words, the clock being sampled) has a 50% duty cycle, it can be seen that when the phase relationship between the two clocks is less than 180 degrees, the sample values will be a logical one ("1"). Conversely, when the relationship is greater than or equal to 180 degree and less than 360 degrees, the corresponding sample value will be logical zero ("0"). Thus, it will be understood that for examples where the first clock signal (i.e. the clock being sampled) does not have a 50% duty cycle, the sample values will be a logical one ("1") when the phase relationship between the two clocks is less than a different threshold value (depending on the duty cycle).

Regardless of the starting phase difference between the two clock signals, the pattern of sample values generated will eventually repeat every M samples, producing the same sequence of logical ones ("1s") and logical zeros ("0s") over again.

Within any repeating pattern, the phase of the first clock signal (e.g. REF_CLK) will bear a unique relationship with the phase of second clock (e.g. CLK2). Thus, by consecutively sampling one of the clocks, a set of unique relationships between the two clocks will be generated. Since the pattern repeats, this also determines what the phase relationship will be M cycles later. For example, if the phase relation between the two clocks at a particular sample is $\phi$, then the phase between the two clocks M cycles later will also be $\phi$. This property can be exploited in situations where there are system timing constraints on when samples can and cannot be taken, e.g. due to the processor being busy with other tasks.

The position (in terms of number of samples) of any given phase relationship within a repeating pattern (with respect to a reference point), will also determine how much the phase progresses the same number of samples later. For example, if the phase relationship of the clock sample at sample position or edge no. 4 has a phase of ϕ degrees, then the phase four samples later will progress by ϕ degrees giving a phase difference of exactly 2ϕ degrees at sample position or edge no. 8. This property is exploited to generate a consistent and determinate phase progression between the two clock signals.

This phase progression will eventually bring the two clocks into approximate alignment and this alignment can be detected by inspecting the sampled values and identifying a certain pattern or sequence of sample values. Accordingly, by sampling one of the clock signals with the other clock signal, and by analysing the sampled values at particular points in time, the alignment between the two clock signals may be determined.

Example 1

Figure 2:
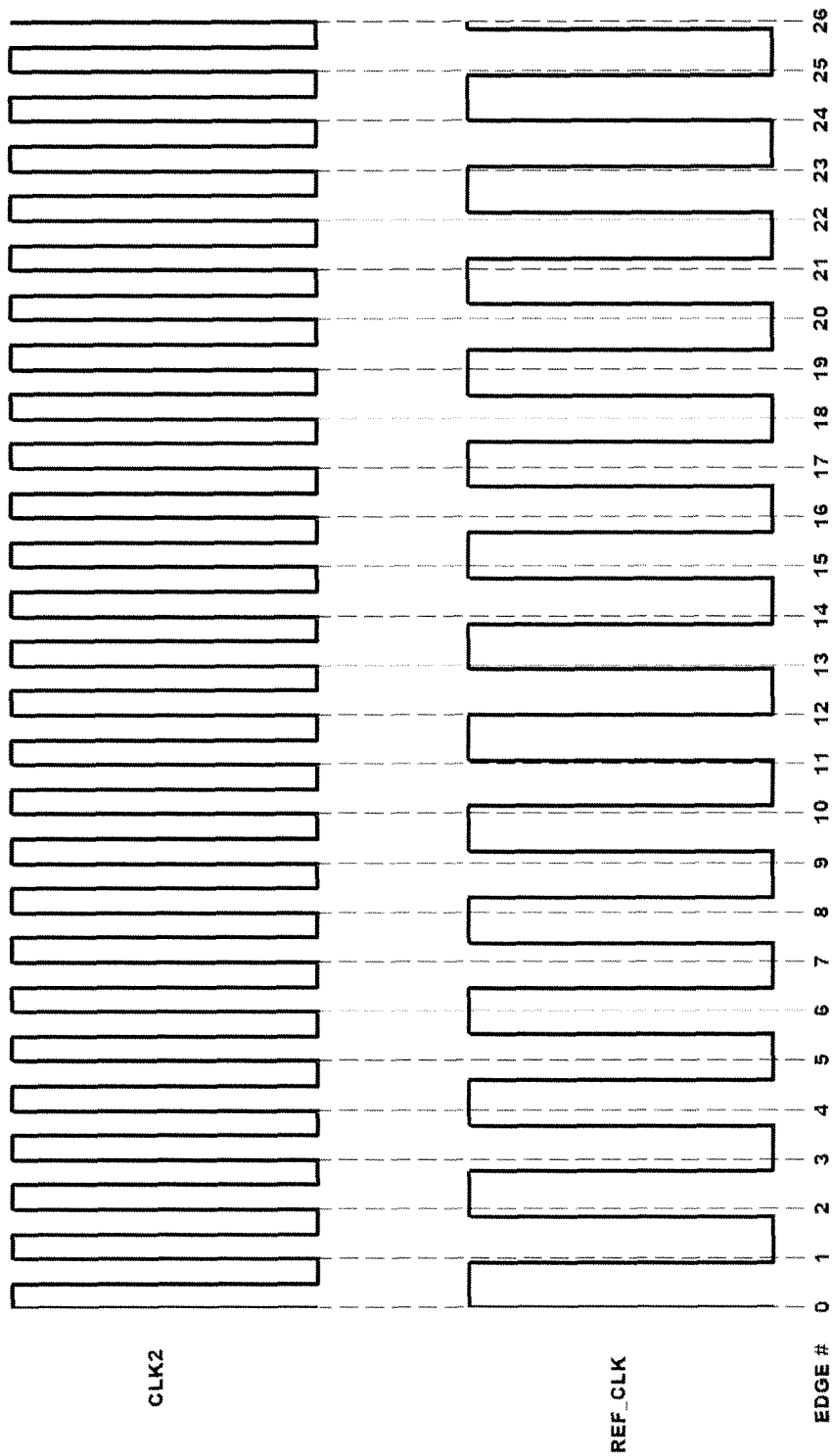
FIG. 2 illustrates the relationship and progression of phase difference between a reference clock of 26 MHz and an internal sampling clock of 48 MHz.

FIG. 2 illustrates the relationship and progression of phase difference between a reference clock REF_CLK of 26 MHz (having a 50% duty cycle) and an internal clock CLK2 of 48 MHz. The phase difference between these two clock signals and the corresponding sampled value of the reference clock REF_CLK which would be measured at a rising edge of the internal clock signal CLK2 is detailed in the table of FIG. 3.

Here, it is noted that a logical one ("1") has been assumed for the case where the signals are in phase and it has been further assumed that the clocks are aligned at the very beginning.

The smallest non-zero phase difference, and consequently phase step between the two clocks is ±15° (at internal clock CLK2 rising edge numbers 11 and 13). The phase difference at a particular internal clock CLK2 rising edge number determines how much the phase will progress exactly that number of samples (or edges) later. For example, at rising edge no. 6, the phase difference between the clock signals is 90°. Therefore, the phase difference at edge no. 12 will be 180°.

Furthermore, it can be seen that the pattern of phase difference repeats every 24 samples. Accordingly, the phase progression will also be 180° degrees at 6+24*n samples later, for any integer n.

In order to find when the clock signals are phase-aligned, one can allow the phase to progress by using the above identified property.

Taking this example, where the minimum non-zero change (i.e. delta amount) in phase alignment between the first and second clock signals is 15° for 13 cycles of the second clock, if one takes a sample every 13+24*n clock cycles, then the phase would shift forward by 15° from the previous measurement. The corresponding samples measured would then be:
  . . . 111111111110000000000001111111111100000 0000000111111111111 . . .

After every set of 12 samples, a transition in the samples is seen. The first transition witnessed in the samples is a transition from 1 to 0, indicating that the clocks signals are 180° out of phase. Therefore, to determine when the clock signals are aligned, one just has to keep reviewing the value of every 13 clock samples (i.e. select sample values separated by N cycles of the second clock signals, where N equals 13) until a transition from logical zero ("0") to logical ("1") is observed. At this point, the phase between the two clock signals is closest to 0°.

It is noted that one can also get the phase to progress in the seemingly reverse direction by taking a sample every 11+24*n clock samples and waiting for a transition from 1 to 0. In practice this can be understood as progressing in the forward direction by 360−15° degrees, which is behaviorally equivalent to progressing by −15° degrees. When this transition is found, one would then need to step the phase in the forward direction just once by taking one sample 13+24*n samples later to obtain 0° alignment. In other words, working in the reverse direction, one will overshoot the in-phase position and consequently need to progress one step in the other direction so that the clock signals have the closest possible alignment.

Example 2

Should a different reference clock REF_CLK signal be employed, an embodiment can be easily adapted to detect alignment of the internal clock (CLK2) with the new reference frequency (REF_CLK).

Figure 4:
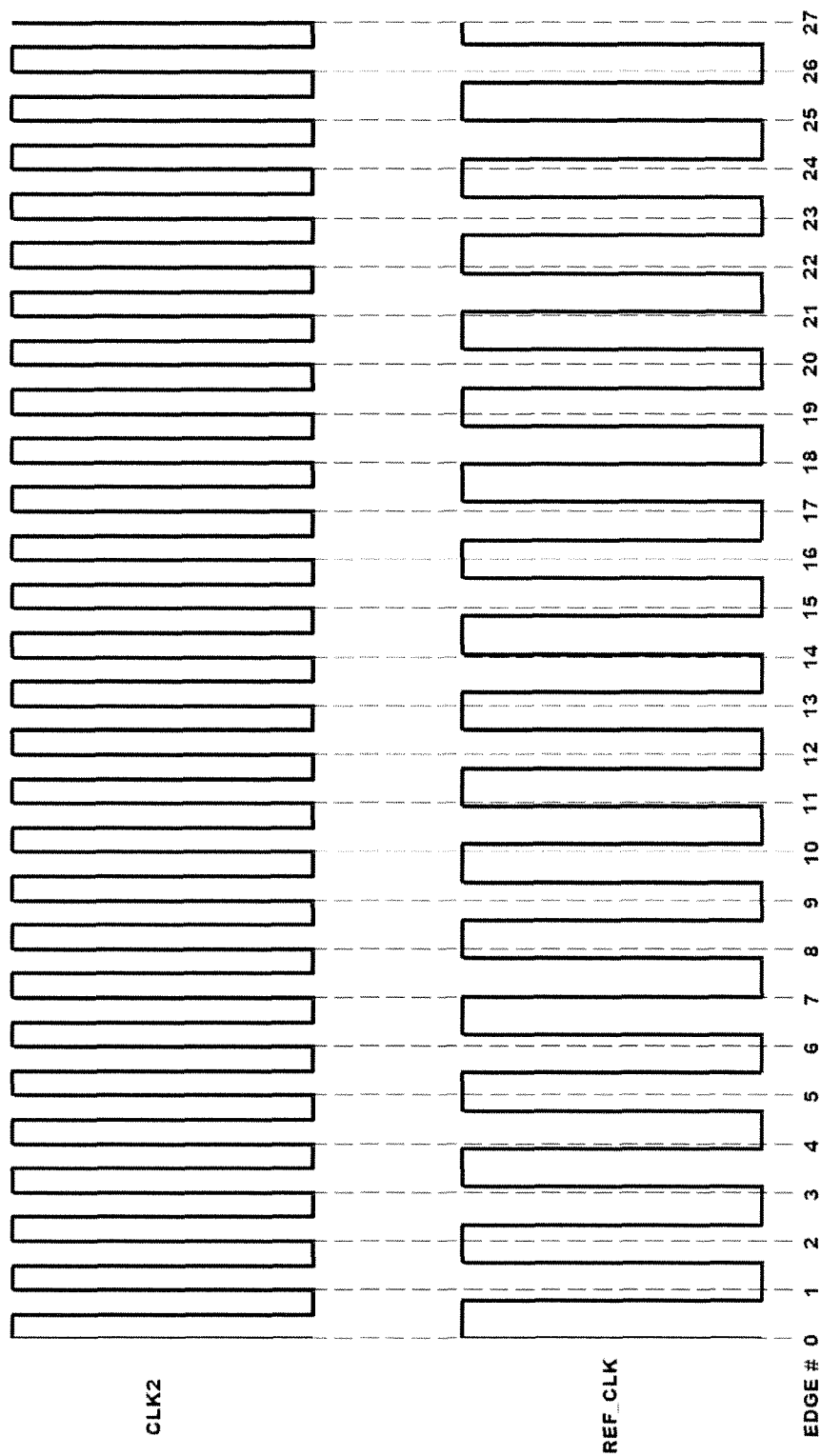
FIG. 4 illustrates the relationship and progression of phase difference between a reference clock of 30.72 MHz and an internal sampling clock of 48 MHz.

For example, consider now a system using a reference frequency REF_CLK of 30.72 MHz with the previous internal clock signal CLK2 having a frequency of 48 MHz. FIG. 4 illustrates the relationship and progression of phase difference between a reference clock REF_CLK of 30.72 MHz and an internal clock CLK2 of 48 MHz (again assuming a starting position of 0 degrees). The phase difference between these two clock signals and the corresponding sampled values of the reference clock REF_CLK measured at the rising edges of the internal clock signal CLK2 is detailed in the table of FIG. 5.

In this example, it is seen that the pattern of phase difference repeats every 25 clock cycles and the smallest phase step (i.e. the minimum non-zero change in phase-alignment between the first and second clock signals) is +14.4° (which occurs during 11 cycles, i.e. at edge no. 11) or 345.6°, equivalent to −14.4° (which occurs during 14 cycles i.e. at edge no. 14). Thus, by taking a sample every 11+25*n or 14+25*n clock cycles (e.g. by selecting N as 11 or 14), the phase will progress forward by 14.4° or 345.6°, respectively.

The concept of identifying when the clock signals have a particular phase difference is otherwise the same as that detailed for the previous example, except that the number of logical ones ("1s") and logical zeros ("0s") in the sequence of sample values is not symmetrical. In other words, one will identify 13 logical ones ("1s") and 12 logical zeros ("0s") before the pattern repeats. This example therefore illustrates that embodiments may not be limited to an even number for the repeating sequence values or indeed to an equal number of logical ones ("1s") and logical zeros ("0s").

Since only the phase progression parameters have changed, one may simply change the parameters of the method to adapt the technique to the new reference clock frequency.

An equation (equation 1) may be used to characterise the phase progression for two clock signals of differing frequency:

$$f_{\Delta t}(t) = [\theta(t+\Delta t) - \theta(t)]/2\pi \Delta t, \qquad (1)$$

which can be rearranged as follows:

$$\Delta \theta = 2\pi t \cdot f_{\Delta t}(t), \qquad (2)$$

where $\Delta t$ is the time of a cycle (i.e. period) of the sampling clock signal, $\Delta \theta$ is the phase progression between the two signals for each cycle of the sampling clock, and where $f_{\Delta t}(t)$ is the frequency of the clock signal being sampled.

Example 3

Entering values for an exemplary case where the reference clock signal has a frequency of 4 MHz and the sampling clock signal has a frequency of 96 MHz (i.e. $f_{\Delta t}$=4 MHz,$\Delta t$=1/96 MHz) gives a phase shift of 0.2618 radians or 15°. Thus, for each cycle of the sampling clock signal, the phase difference between the two signals will progress by 15°. The phase difference between these two clock signals and the corresponding sampled values of the first clock signal measured at the rising edges of the sampling clock signal is detailed in the table of FIG. 6. Since θ=θ±360°, one can think in terms of relative phase shifts (rather than absolute), i.e. a phase progression which repeats as shown in the third row of the table of FIG. 6.

The number of samples it takes before the phase "repeats" can be determined by dividing the sampling clock frequency by the greatest common divisor of the sampling clock and the reference clock. For example, in this case where the sampling clock frequency is 96 MHz and the greatest common (frequency) divisor between the two clocks (96 MHz and 4 MHZ) is 4 MHz. Thus, the sequence repeats every 24 samples.

Selecting every 13$^{th}$ sample, the phase progression between the clocks is 195°. The corresponding samples measured would then be:

. . . 10101010101001010101010101101 . . .

Here, a 0→1 transition does not uniquely identify the phase-alignment. However, it is still possible to determine when the phase between the clocks is closest to 0. To see this, one needs to consider the sequence of samples above. In this situation, phase-alignment is not given by a transition from logical zero ("0") to logical one ("1") or logical one ("1") to logical zero ("0"), but rather by two consecutive logical ones (i.e. the sequence "11"). Another way of looking at this is the phase-alignment is given where the sequence switches from a logical zero ("0") to logical one ("1") pattern to a logical one ("1") to logical zero ("0") pattern. Similarly, completely out of phase clocks is given by two consecutive logical zeros (i.e. "00") or where the sampled sequence switches from a logical one ("1") to logical zero ("0") pattern to a logical zero ("0") to logical one ("1") pattern. Note that, as in the nominal case with a stream of consecutive logical zeros ("0s") followed by a stream of consecutive ones, there is no lag with detection.

Example 4

In the cases where the phase step/progression size is such that a stream of consecutive ones followed by a stream of consecutive logical zeros ("0s") is generated, only a transition in sample value needs to be detected. Using larger phase step/progression sizes, as we saw in the previous example above may require more complicated sequences of sample values to be detected.

For example, using the clock signals of Example 1 (REF_CLK of 26 MHz and an internal clock CLK2 of 48 MHz) and selecting every 23rd sample, the phase progression between the clocks is 165°. For the situation where the phase progression size is 165°, the corresponding samples measured would then be:

. . . 110101010101001010101010110 . . .

Here, in this example, phase-alignment (e.g. a phase difference of 0°) is not identified by a transition from logical zero ("0") to logical one ("1") in the sample values but rather by a logical zero ("0") to logical one ("1") transition followed by a consecutive logical one ("1") (in other words, the sequence "011"). Similarly, for detection of when the clocks are completely out of phase (e.g. a phase difference of 180°), a transition from logical one ("1") to logical zero ("0") followed by a consecutive logical zero ("0") (i.e. the sequence "100") is sought.

Note, with this phase progression size of 165°, alignment is only known on the arrival of the next sample after the transition. Thus, in order to detect exactly when the signals are aligned (or completely unaligned), one would need to count the number of logical zero ("0") to logical one transitions so that the position of exactly zero (or 180 degrees) phase is detected.

Example 5

Consider now a further example where, using the clock signals of Example 1 (REF_CLK of 26 MHz and an internal clock CLK2 of 48 MHz) and selecting 5$^{th}$ every sample, the phase progression between the clocks is 255°. For such a situation where the phase progression size is 255°, the corresponding samples measured would then be:

. . . 1011001001100100110110 . . .

Here there is no logical zero ("0") to logical one ("1") transition on the synchronised position, i.e. where the phase sampled is 0 degrees. Rather the transition happens one sample earlier. Thus detection of the alignment between the two clocks in this situation is yet again different. Here the unique identifying sequence is the pattern of "110011". Thus, this example illustrates that sometimes more involved patterns arise which need to be detected.

Practical Considerations

In some situations, the sample closest to the transition from logical one ("1") to logical zero ("0") or logical zero ("0") to logical one ("1") can be in error. This can occur because of metastability, (e.g. when the clocks are perfectly aligned, they are simultaneously rising) and thus the sampled value may be indeterminate or not defined. However, metastability is unlikely to propagate since the next sample value used will be several cycles of the sampling clock later, by which point the measurement should have settled. In this situation, the phase-alignment will be out by the minimum step size. Thus, the proposed technique is fairly robust to metastability.

In examples 1 and 2 above, the smallest phase progression size has been used to progress the phase in either a forwards or backwards direction. In embodiments, it may be preferred to use the smallest phase progression/step size so as to minimise error. An equation (equation 3) may be used to determine the smallest phase progression/step size for any pair of clock signals (having different frequencies):

$$\min(a_k)_{k=1}^{M-1} \quad (3)$$

Where $a_k$ defines the sequence mod $$\left(\frac{F_{clk1} * k * 360}{F_{clk2}}, 360\right)$$

for all integer values of k, which is bounded between k=1 (lower) and k=M−1 (upper) with $$M = \frac{F_{clk2}}{gcd(F_{clk1}, F_{clk2})}$$

(gcd = greatest common denominator)

and $F_{clk1}$ is the frequency of the first clock (the clock signal being sampled, e.g. REF_CLK) and $F_{clk2}$ is the frequency of the second clock signal (the clock signal doing the sampling, e.g. CLK2). M is the number of samples before the sequence repeats.

By way of example, with $F_{ad}$=30.72 MHz, $F_{clk2}$=48 MHz, min(ak) is a(k)=14.4 degrees at k=11 (In other words, 11 clock cycles of 48 MHz means a phase shift on 30.72 MHz of 14.4°). However, it is noted that for this example one may use k=14, where there is a phase shift of 345.6° (or −14.4°). Thus, it will be appreciated that the alternative equation $\max(a_k)_{k=1}^{M-1}$ may be used to provide a behavioural equivalent of progressing backwards in phase.

However, the invention will also work with other phase difference progressions with the limitation that the bounded error during a metastability event may be larger. The advantage of using larger phase progression size is that synchronisation will be detected faster. It may therefore be used for quick and coarse detection, which can then be improved upon afterwards by repeating with a smaller phase progression size.

The proposed technique can make use of phase progression in both directions. For example, if a sequence of ones has been sampled every N cycles of the sampling clock signal (where N is an integer greater than 1), it may be faster to achieve phase synchronisation by progressing in a manner that represents a backwards phase progression until a logical one ("1") to logical zero ("0") transition is identified and then progressing in a manner that represents a forward phase progression (i.e. in the opposite direction) by one sample value at which point a transition from logical zero ("0") to logical one ("1") is seen/detected.

For a given sampling frequency $f_{CLK1}$, it can be shown theoretically that the proposed concept will work for all non-harmonically related reference frequencies $f_{REF\_CLK}$. However, some frequencies may exhibit extraordinarily long sequences before repetition is seen, thus limiting their application in practice. For example, staying with example 3 above, but sampling a reference frequency of 16.367667 MHz (instead of the 26 MHz) with a sampling clock frequency of 48 MHz will, in theory, work. Although the smallest phase shift in this case is approximately ±22.5×10−6 degrees leading to very high phase resolution, the sequence only repeats after approximately 16 million cycles. This example demonstrates the trade-off between phase resolution and the number of samples required before the phase sequence repeats.

In the above examples, the detection of a phase-alignment between the two clock signals is achieved by looking for a specific pattern or sequence of sample values of a reference clock signal that has been sampled using a second clock signal. In one embodiment, the sequence is a transition from logical zero ("0") to logical one ("1"). In a similar manner, one could detect a 180 degrees phase difference between the two clock signals by waiting until a transition from logical one ("1") to logical zero ("0") is observed.

In fact, the alignment of the clocks need not be confined to the extremes of completely in phase (0°) or totally out of phase (180°). For such examples, it is also possible to align the clocks to an arbitrary alignment by watching for a transition from logical zero ("0") to logical one ("1") (or logical one ("1") to logical zero ("0")) and counting a specific number of clock samples from this transition point. For example, where the reference clock is 26 MHz and the sampling clock is 48 MHz, one could detect an alignment of 30 degrees by first waiting until a transition from logical zero ("0") to logical one ("1") is observed and then counting two lots of 13+24*n sampling clock cycles (where n=0, 1, 2, 3, ... etc), because it has been identified that the phase difference between the two clock signals progresses by 15° every 13 cycles of the sampling clock signal. Alternatively, one may wait until a transition from logical zero ("0") to logical one ("1") is detected and then take the second sample from this transition (thus, employing the property that edge no. 2 gives a 30° progression).

Figure 7:
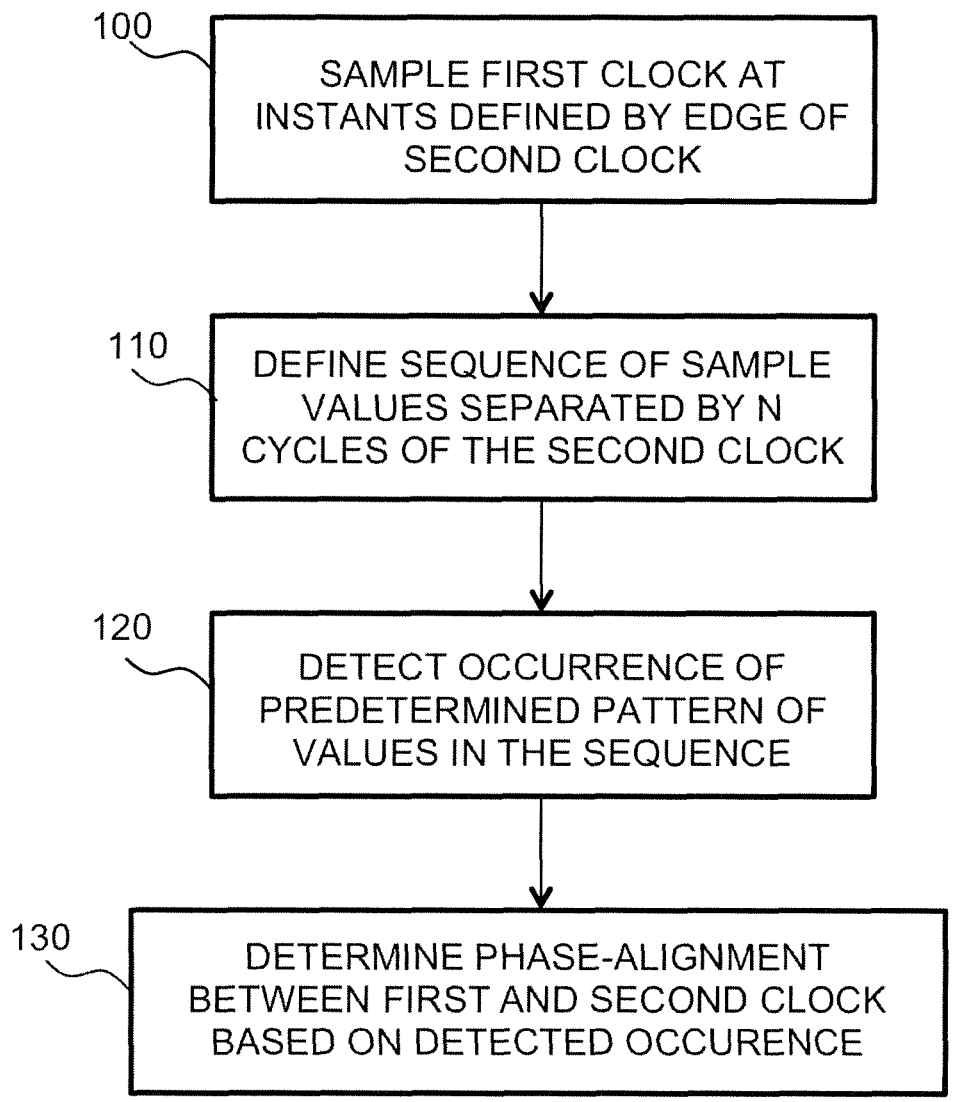
FIG. 7 is a flow diagram of a method according to an embodiment.

Referring now to FIG. 7, there is shown a flow diagram of a method of determining a phase-alignment between first and second clock signals of differing frequency according to an embodiment of the invention. The method begins in step 100 wherein a value of the first clock signal is sampled at time instants defined by an edge of the second clock signal. Here, the edge of the second clock signal used to time the sampling of the first clock signal may be the rising edge of the second clock signal.

Next, in step 110, a sequence of samples of the first clock signal is defined by selecting samples of the first clock signal that are separated by N cycles of the second clock signal, where N is an integer greater than 1. In other words, samples of the first clock signal which were obtained at times separated by N whole cycles (N>1) are used to create a sequence of sampled values. Thus, for example, if the first clock signal has been sampled at every rising edge of the second clock signal, a sequence may be created from every Nth sampled value (where N>1). In another example, if the first clock signal has been sampled at every Nth (where N>1) rising edge of the second clock signal, a sequence of sampled values may be created from every sample, or even from every Mth sample, M being an integer greater than N.

The occurrence of a predetermined pattern of values in the sequence is then detected in step 120. As has been demonstrated in previous embodiments described above, such a detection step may comprise detecting two consecutive sample values of the sequence having opposing value, or may comprise detecting a logical zero ("0") to logical one ("1") transition followed by a consecutive logical one ("1") (in other words, the sequence "011"). Here, it will be appreciated that the exact pattern of values to be detected may depend on various factors such as the frequencies of the first and second clock signals and/or a desired phase-alignment to be detected.

Based on the detected occurrence of the predetermined pattern, a phase-alignment between the first and second clock signals is then determined in step 130.

Although the above embodiments have been illustrated sampling on a positive or rising edge of the sampling clock signal, it should be clear that the invention could instead employ a negative or falling edge of the internal clock. The sampled data may be different in this case, however the functionality remains the same.

Figure 8:
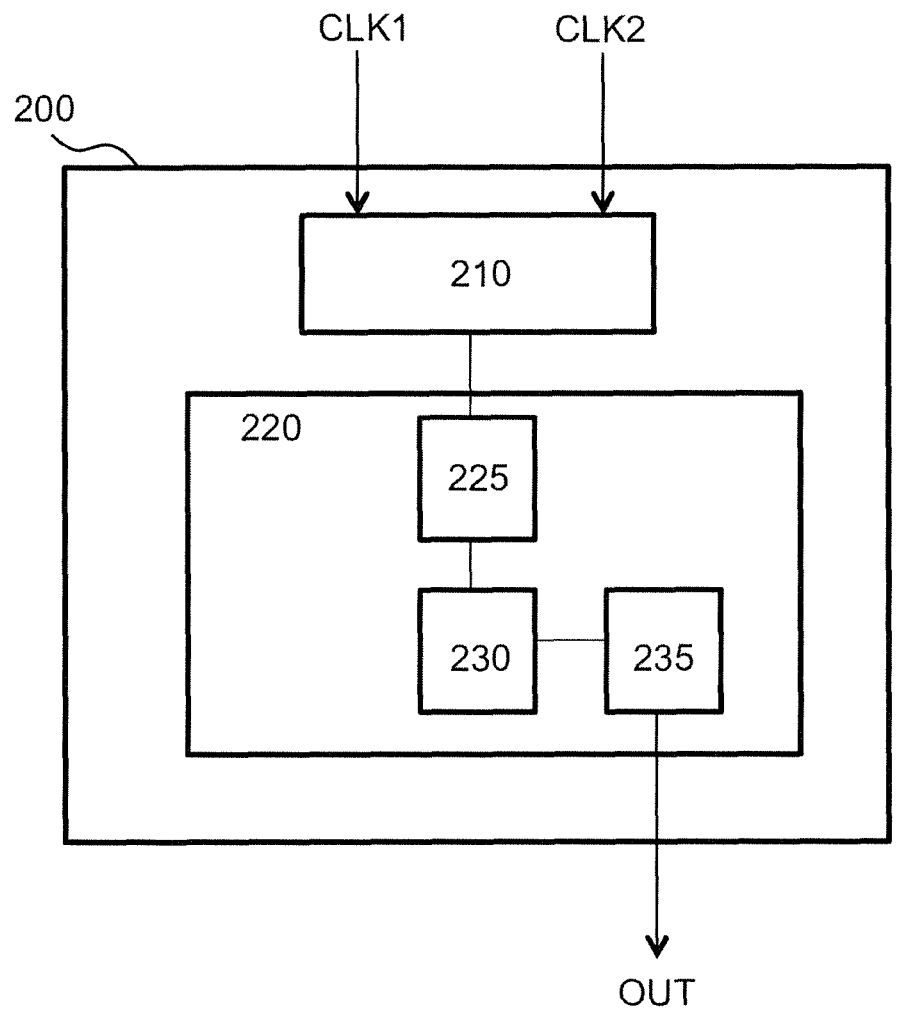
FIG. 8 is a schematic block diagram of a system according to an embodiment of the invention.

Referring now to FIG. 8, there is shown a schematic block diagram of a system 200 for determining a phase-alignment between first and second clock signals of differing frequency according to an embodiment of the invention. The system 200 comprises a sampling unit 210 and a data processing unit 220. The data processing unit 220 comprises a processing unit 225, a pattern detection unit 230, and a phase-alignment determination unit 235.

The sampling unit 210 receives the first CLK1 and second CLK2 clock signals and samples the first clock signal using the second clock signal. For example, the sampling unit 210 determines the value of the first clock signal at every rising edge of the second clock signal.

The sampled values are provided from the sampling unit 210 to the data processing unit 220 for processing. More specifically, the sampled values are provided to the processing unit 225 of the data processing unit 220, wherein the sampled values are used to create a sequence of successive samples of the first clock signal that are separated by N cycles of the second clock signal, where N is an integer greater than 1. After creating the sequence, the processing unit 225 provides the sequence to the pattern detection unit 230 unit within the data processing unit 220. The pattern detection unit 230 analyses the sequence in an attempt to detect the occurrence of a predetermined pattern of values in the sequence. The result(s) of the analysis are provided to the phase-alignment determination unit 235 which determines a phase-alignment between the first CLK1 and second CLK2 clock signals using the result(s) provided to it. In other words, the phase-alignment unit 235 determines a phase-alignment between the first CLK1 and second CLK2 clock signals based on the detected occurrence of the predetermined pattern by the pattern detection unit 230.

The phase-alignment unit 235 outputs a signal representing the determined phase-alignment for use by a user and/or a separate apparatus/system. By way of example, the output signal may simply comprise a pulse signal at a time when the two clocks are aligned.

By way of example, the signal representing the determined phase-alignment may be provided to the receiver of FIG. 1 so that the timing (e.g. PPS) signal of the timing application can be aligned to the external or reference clock frequency. For this, one may employ two registers inside the baseband processor to align the timing (e.g. PPS) signal to the new clock frequency. As soon as phase-alignment is detected, the register for storing the current time in clock cycles (e.g. TSW register) and the register for recording the time of the last millisecond clock pulse (e.g. TMS register) are read and the difference between these two readings is calculated. When generating future occurrences of the timing (e.g. PPS) signal, this difference is applied to align the timing signal to the REF_CLK or CLK1.

In a system comprising two clock signals provided from independent sources, although the approximate frequencies of the signals may be known, they may have a small relative frequency error due to being provided from different sources. A more accurate appreciation of the actual relative frequencies of such signals may therefore be desired.

It has been realised that the proposed concept for determining a phase-alignment between first and second clock signals may also be extended to frequency measurement, and in particular the measurement of relative frequency error. Using such a proposed concept, a relative frequency error between two independent clock signals may be ascertained.

For example, an embodiment of determining phase-alignment between first and second clock signals may be employed every millisecond (ms) in a system having a first clock signal with a nominal frequency of 26 MHz (i.e. $F_{ext}$=26 MHz) provided from a first source (e.g. from a first crystal). For the exemplary case where an internal sampling clock signal of the system has a nominal frequency of 48 MHz (i.e. $F_{clk2}$=48 MHz), but is provided from a second source (e.g. from a second crystal), it will be understood that the two oscillators (i.e. the first clock signal and the internal sampling clock) may have a small relative frequency error with respect to their nominal frequencies.

If, every millisecond, one measures the phase of the first clock signal (having an expected frequency of 26 MHz) against the internal sampling clock signal (having an expected frequency of 48 MHz), the phase difference between the two signals would be seen to slowly change (because of the small relative frequency error between the two signals). Over the course of a predetermined time period (such as one second for example), the phase difference measurements may be added up and then used to work out what the frequency error was over that time period.

So, by way of example, if one assumes that for every 1 ms the phase alignment or difference between the two signals advances by 15° (e.g. smallest possible phase measurement for these two clock signals using the technique described earlier), the phase measurements would progress as 15°, 30°, 45°, 60°, and so on. Over the 1000 measurements in a time period of one second, one thousand (1000) steps of 15 degrees would be observed, which equates to 41.6' (1000*15°/360°) cycles.

Conversely, if one compares the frequency of the two signals in a conventional way (by counting the number of cycles of each signal in the time period), a measurement of 26 000 041 cycles would be obtained during 48 000 000 cycles of the internal sampling clock.

It will therefore be appreciated that the accuracy of the conventional method of counting whole cycles is much lower than the proposed concept of using phase measurements. More specifically, in the above example (where for every 1 ms the phase difference between the two signals shifts by 15°), the proposed concept provides a range of 24 (360°/15°) possible values between each cycle (e.g. 15°, 30°, 45°, etc), with an uncertainty of 15° (i.e. +−7.5°). The conventional method of counting whole cycles provides an uncertainty 360° of +/−180°.

For example, if the actual frequency of the first clock signal is 26 MHz+1.5 Hz error (i.e. 26000001.5 Hz), and the actual frequency of the internal sampling clock is 48 MHz+1 Hz error (i.e. 48000001 Hz), the proposed concept can be employed to observe the relative error, which in this case is 0.5 Hz.

Thus, there is proposed a concept for measuring the relative frequency error of one clock signal against another. The concept may employ a method of measuring the phase-alignment between two signals (as described above according to exemplary embodiment of the invention). Such a phase measurement method may be repeated periodically so as to enable the relative frequency to be measured repeatedly (and thus monitored for example) or to obtain a better estimate of the relative frequency error over time.

A first clock signal may therefore be compared to a second (reference) clock signal that is highly accurate and stable, for example. Any determined frequency error of the first clock signal may then be corrected or accounted for. This may allow for faster startup times in GNSS systems. Conversely, such a system could be used to accurately measure the frequency of an external clock against a GNSS source, if the GNSS system provides an accurate measure of the internal clock.

Figure 9:
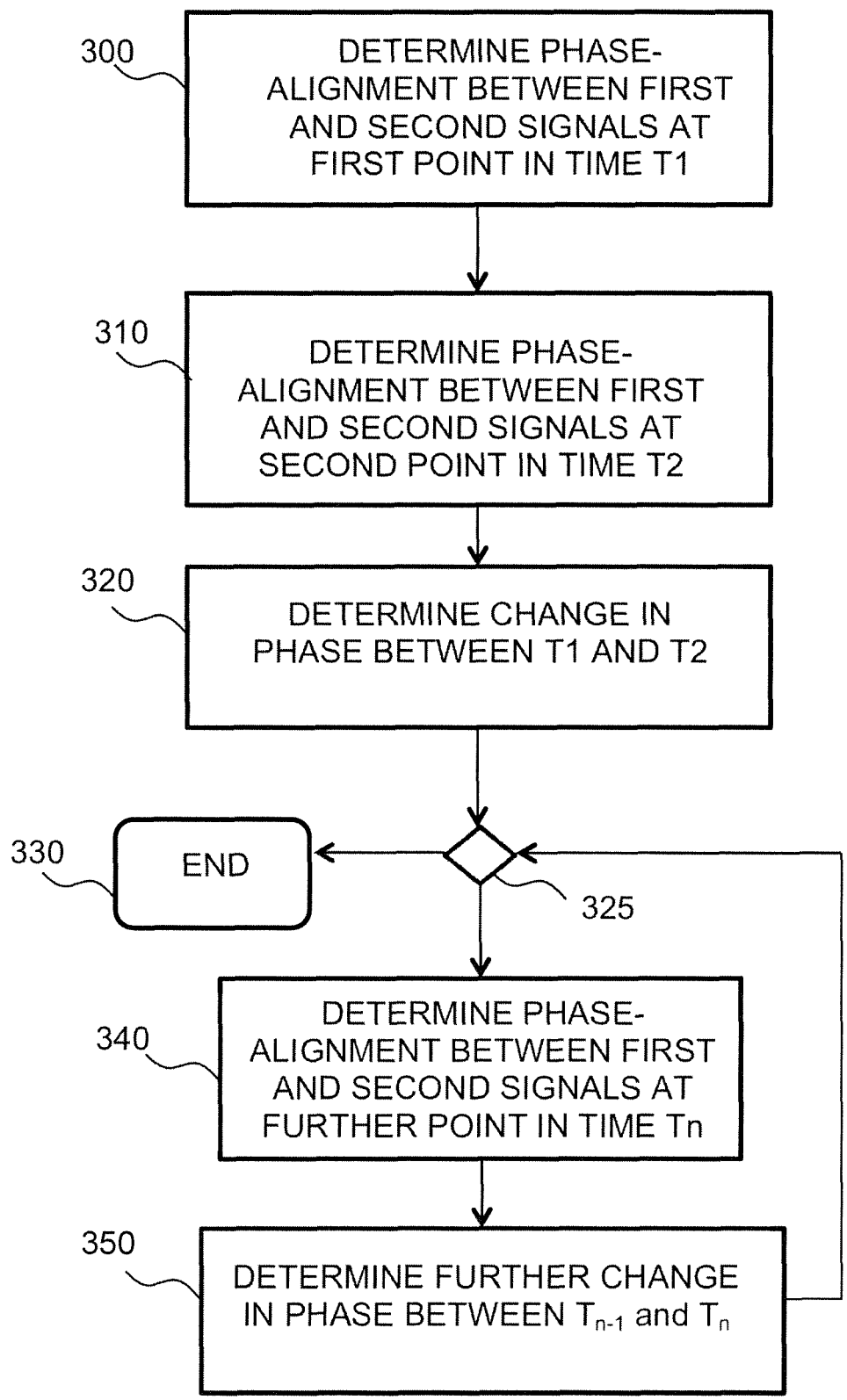
FIG. 9 is a flow diagram of a method of comparing the frequency of first and second clock signals according to a proposed embodiment.

Referring now to FIG. 9, there is shown a flow diagram of a method of comparing the frequency of first and second clock signals according to a proposed embodiment. The method begins in step 300 wherein the phase-alignment between first and second clock signals is determined at a first point in time T1. Here, the step 300 of determining the phase-alignment is undertaken by employing an embodiment of the invention as described earlier (such as the method shown in FIG. 7 for example). Thus, for a first time T1, a measurement of the phase-alignment between the first and second clock signals is obtained.

Next, in step 310, the phase-alignment between the first and second clock signals is determined at a second point in time T2 (the second point in time T2 being a predetermined amount of time after the first point in time T1). As with step 300, the step 310 of determining the phase-alignment is undertaken by employing an embodiment of the invention as described earlier (such as the method shown in FIG. 7 for example). Thus, for a second time T2, a measurement of the phase-alignment between the first and second clock signals is obtained.

Accordingly, it will be appreciated that, having undertaken steps 300 and 310, two phase-alignment measurements between the first and second clock signals at first time T1 and second time T2, respectively, have been obtained. From these phase-alignment measurements, the change in phase for the time period from T1 to T2 is determined in step 320.

The calculated change in phase may then be used to work out the relative frequency error between the first and second clock signal over the time period T1 to T2. A measure of relative frequency error can therefore be obtained after completion of step 320 by looking at the phase shift, i.e. phase difference per unit time. It may therefore be decided, at step 325, that no further phase-alignment measurements are needed, in which case the method ends in step 330.

However, should it be decided in step 325 that further phase-alignment measurements are desired (to monitor any variation in relative frequency error, for example), the method proceeds to steps 340 and 350.

In step 340, the phase-alignment between the first and second clock signals is determined at a further point in time $T_n$ (the further point in time $T_n$ being a predetermined amount of time after the previously used point in time $T_{n-1}$). As with steps 310 and 320, the step 340 of determining the phase-alignment is undertaken by employing an embodiment of the invention as described earlier (such as the method shown in FIG. 7 for example). Thus, for a further point in time $T_n$, a measurement of the phase-alignment between the first and second clock signals is obtained.

From these obtained phase-alignment measurements, the change in phase for the time period from $T_{n-1}$ to $T_n$ is then determined in step 350. The calculated change in phase may then be used to work out the phase difference between the first and second clock signal over the time period $T_{n-1}$ to $T_n$. An updated measure of relative frequency error can therefore be obtained after completion of step 350.

The method then returns back to step 325 where it is decided if further phase-alignment measurements are desired. Based on the outcome of the decision, the method then either ends in step 330 or proceeds once again to steps 340 and 350.

It may therefore be appreciated that repeated completion of steps 340 and 350 essentially embodies an accumulation of phase-alignment measurements.

Repeated calculation of the change in phase may be used to monitor the relative frequency error over time and/or to obtain a more accurate reading of the relative frequency error.

It will be appreciated that there is proposed a method for comparing the frequency of first and second clock signals, the method comprising the steps of: determining a first change in phase between the first and second clock signals during a first predetermined period of time.

The method may further comprise the step of: based on the determined first change in phase, calculating a second change in phase between the first and second clock signals during a second predetermined period of time, the second predetermined period of time being greater than the first predetermined period of time.

The step of determining a first change in phase may employ a method of determining a phase-alignment between first and second clock signals according to an embodiment of the invention (as described earlier for example).

The first predetermined period of time may be selected such that the first change (i.e. delta amount) in phase-alignment between the first and second clock signals is less than 360°, preferably less than or equal to 255°, more preferably less than or equal to 225°, even more preferably less than or equal to 195°, even more preferably less than or equal to 165°, more preferably less than or equal to 30°, more preferably less than or equal to 90°, and even more preferably less than or equal to 15°. In other words, the first predetermined period of time may be selected such that the change in phase-alignment between the first and second clock signals (otherwise referred to as a 'delta amount') is a minimum non-zero value determined by the frequencies of the first and second clock signals.

Also, the second predetermined period of time may be selected such that the second change in phase between the first and second clock signals is greater than or equal to T*360°, where T is greater than or equal to 1. Preferably, T is greater than or equal to 10, more preferably greater than 100, even more preferably greater than 500, and even more preferably greater than 1000. In other words, the second predetermined period of time may be selected such that the change in phase between the first and second clock signals is an order of magnitude greater than the change in phase between the first and second clock signals during the first predetermined period of time.

There is also proposed a system for comparing the frequency of first and second clock signals, the system comprising the steps of: a processing unit adapted to determine a first change in phase between the first and second clock signals during a first predetermined period of time.

The system may further comprise: a calculation unit adapted to calculate a second change in phase between the first and second clock signals during a second predetermined period of time based on the determined first change in phase, wherein the second predetermined period of time is greater than the first predetermined period of time.

The system may employ a system for determining a phase-alignment between first and second clock signals according to an embodiment of the invention (as described earlier for example).

The concept for comparing the frequency of first and second clock signals may be employed in a Global Navigation Satellite System receiver, thereby allowing improved accuracy.

Accordingly, it will be clear to one of ordinary skill in the art that all or part of the method of one embodiment of the present invention may suitably and usefully be embodied in a logic apparatus, or a plurality of logic apparatus, comprising logic elements arranged to perform the steps of the method and that such logic elements may comprise hardware components, firmware components or a combination thereof.

It will be equally clear to one of skill in the art that all or part of a logic arrangement according to one embodiment of the present invention may suitably be embodied in a logic apparatus comprising logic elements to perform the steps of the method, and that such logic elements may comprise components such as logic gates in, for example a programmable logic array or application-specific integrated circuit. Such a logic arrangement may further be embodied in enabling elements for temporarily or permanently establishing logic structures in such an array or circuit using, for example, a virtual hardware descriptor language, which may be stored and transmitted using fixed or transmittable carrier media.

It will be appreciated that the method and arrangement described above may also suitably be carried out fully or partially in software running on one or more processors (not shown in the figures), and that the software may be provided in the form of one or more computer program elements carried on any suitable data-carrier (also not shown in the figures) such as a magnetic or optical disk or the like. Channels for the transmission of data may likewise comprise storage media of all descriptions as well as signal-carrying media, such as wired or wireless signal-carrying media.

A method is generally conceived to be a self-consistent sequence of steps leading to a desired result. These steps require physical manipulations of physical quantities. Usually, though not necessarily, these quantities take the form of electrical or magnetic signals capable of being stored, transferred, combined, compared, and otherwise manipulated. It is convenient at times, principally for reasons of common usage, to refer to these signals as bits, values, parameters, items, elements, objects, symbols, characters, terms, numbers, or the like. It should be noted, however, that all of these terms and similar terms are to be associated with the appropriate physical quantities and are merely convenient labels applied to these quantities.

The present invention may further suitably be embodied as a computer program product for use with a computer system. Such an implementation may comprise a series of computer-readable instructions either fixed on a tangible medium, such as a computer readable medium, for example, e.g. a CD-ROM, DVD, USB stick, memory card, network-area storage device, internet-accessible data repository, and so on, or transmittable to a computer system, via a modem or other interface device, over either a tangible medium, including but not limited to optical or analogue communications lines, or intangibly using wireless techniques, including but not limited to microwave, infrared or other transmission techniques. The series of computer readable instructions embodies all or part of the functionality previously described herein.

Those skilled in the art will appreciate that such computer readable instructions can be written in a number of programming languages for use with many computer architectures or operating systems. Further, such instructions may be stored using any memory technology, present or future, including but not limited to, semiconductor, magnetic, or optical, or transmitted using any communications technology, present or future, including but not limited to optical, infrared, or microwave. It is contemplated that such a computer program product may be distributed as a removable medium with accompanying printed or electronic documentation, for example, shrink-wrapped software, pre-loaded with a computer system, for example, on a system ROM or fixed disk, or distributed from a server or electronic bulletin board over a network, for example, the Internet or World Wide Web.

In one alternative, one embodiment may be realized in the form of a computer implemented method of deploying a service comprising steps of deploying computer program code operable to cause the computer system to perform all the steps of the method when deployed into a computer infrastructure and executed thereon.

In a further alternative, one embodiment may be realized in the form of a data carrier having functional data thereon, the functional data comprising functional computer data structures to, when loaded into a computer system and operated upon thereby, enable the computer system to perform all the steps of the method.

The flowchart and block diagram in the above figures illustrate the architecture, functionality, and operation of possible implementations of systems, methods and computer program products according to various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While one or more embodiments have been illustrated in detail, one of ordinary skill in the art will appreciate that modifications and adaptations to those embodiments may be made.

Other variations to the disclosed embodiments can be understood and effected by those skilled in the art in practising the claimed invention, from a study of the drawings, the disclosure, and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

The invention claimed is:

1. A method of determining a phase-alignment between first and second clock signals of differing frequency, the method comprising the steps of:
    sampling a value of the first clock signal at instants defined by an edge of the second clock signal;
    defining a sequence of the sampled values of the first clock signal, wherein consecutive sample values in the sequence are separated by N cycles of the second clock signal, and wherein N is an integer greater than 1;
    detecting the occurrence of a predetermined pattern of values in the defined sequence; and
    determining a phase-alignment between the first and second clock signals based on the detected occurrence of the predetermined pattern.

2. The method of claim 1, wherein the step of sampling comprises:
    sampling a value of the first clock signal every N cycles of the second clock signal.

3. The method of claim 1 or 2, wherein the phase-alignment between the first and second clock signals changes by a delta amount during N cycles of the second clock signal, and wherein N is selected such that the delta amount is a minimum non-zero value obtainable for the first and second clock signals.

4. The method of claim 3, wherein the minimum non-zero delta amount obtainable for the first and second clock signals equals $\min(a_k)_{k=1}^{M-1}$,
    where $a_k$ defines the sequence mod $$\left( \frac{F_{clk1} * k * 360}{F_{clk2}}, 360 \right)$$

for all integer values of k, which is bounded between k=1 and k=M−1 with $$M = \frac{F_{clk2}}{gcd(F_{clk1}, F_{clk2})},$$

gcd is the greatest common denominator, $F_{clk1}$ is the frequency of the first clock, and $F_{clk2}$ is the frequency of the second clock signal.

5. The method of claim 3, wherein N is selected such that the delta amount is less than 120°.

6. The method of claim 1, wherein the predetermined pattern of values comprises two consecutive sample values of the sequence of opposing value thereby indicating that the first and second clock signals are 0° or 180° degrees out of phase.

7. The method of claim 1 or 2, wherein the phase-alignment between the first and second clock signals changes by a delta amount during N cycles of the second clock signal, and N is selected such that the delta amount is 165°, and wherein the predetermined pattern of values comprises three consecutive sample values of the sequence, the first and second consecutive sample values being of opposing value and the third consecutive sample value being equal to the second consecutive sample value.

8. A method of iteratively determining a phase-alignment between first and second clock signals of differing frequency, the method comprising the steps of:

determining a first estimate of phase-alignment between the first and second clock signals according to claim 1, wherein N is equal to a first value P and the phase-alignment between the first and second clock signals changes by a first delta amount during P cycles of the second clock signal; and determining a second estimate of phase-alignment between the first and second clock signals according to claim 1, wherein N is equal to a second value Q different from the first value P, and wherein the phase-alignment between the first and second clock signals changes by a second delta amount during Q cycles of the second clock signal, wherein the first value P and second value Q are such that the second delta amount is smaller than the first delta amount.

9. A method of generating a timing signal in a Global Navigation Satellite System, GNSS, receiver comprising:

determining a phase-alignment between first and second clock signals of differing frequency according to claim 1; and generating a timing signal based on the determined phase-alignment.

10. A method for comparing the frequency of first and second clock signals comprising the steps of:

determining a first phase-alignment between first and second clock signals at a first time instant according to claim 1;

determining a second phase-alignment between first and second clock signals at a second time instant according to claim 1, the second time instant being a first predetermined period of time after the first time instant; and determining a change in phase between first and second clock signals based on the determined first phase-alignment and the determined second phase-alignment.

11. A system for determining a phase-alignment between first and second clock signals of differing frequency, the system comprising:

a sampling unit adapted to sample a value of the first clock signal at instants defined by an edge of the second clock signal;

a processing unit adapted to define a sequence of the sampled values of the first clock signal, wherein consecutive sample values in the sequence are separated by N cycles of the second clock signal, and wherein N is an integer greater than 1, and a detection unit adapted to detect the occurrence of a predetermined pattern of values in the defined sequence; and a phase-alignment determination unit adapted to determine a phase-alignment between the first and second clock signals based on the detected occurrence of the predetermined pattern.

12. The system of claim 11, wherein the sampling unit is adapted to sample a value of the first clock signal every N cycles of the second clock signal.

13. The system of claim 11 or 12, wherein the phase-alignment between the first and second clock signals changes by a delta amount during N cycles of the second clock signal, and wherein N is selected such that the delta amount is a minimum non-zero value obtainable for the first and second clock signals.

14. The system of claim 13, wherein the minimum non-zero delta amount obtainable for the first and second clock signals equals $\min(a_k)_{k=1}^{M-1}$, where $a_k$ defines the sequence mod $$\left(\frac{F_{clk1} * k * 360}{F_{clk2}}, 360\right)$$

for all integer values of k, which is bounded between k=1 and k=M−1 with $$M = \frac{F_{clk2}}{gcd(F_{clk1}, F_{clk2})},$$

gcd is the greatest common denominator, $F_{clk1}$ is the frequency of the first clock, and $F_{clk2}$ is the frequency of the second clock signal.

15. The system of claim 11, wherein the predetermined pattern of values comprises two consecutive sample values of the sequence of opposing value thereby indicating that the first and second clock signals are 0° or 180° degrees out of phase.

16. The system of claim 11, wherein the phase-alignment between the first and second clock signals changes by a delta amount during N cycles of the second clock signal, and N is selected such that the delta amount is 165°, and wherein the predetermined pattern of values comprises three consecutive sample values of the sequence, the first and second consecutive sample values being of opposing value and the third consecutive sample value being equal to the second consecutive sample value.

17. The system of claim 11, wherein the system is adapted to determine a first estimate of phase-alignment between the first and second clock signals according to any preceding claim, wherein N is equal to a first value P and the phase-alignment between the first and second clock signals changes by a first delta amount during P cycles of the second clock signal; and and wherein the system is further adapted to determine a second estimate of phase-alignment between the first and second clock signals according to any preceding claim, wherein N is equal to a second value Q different from the first value P, and wherein the phase-alignment between the first and second clock signals changes by a second delta amount during Q cycles of the second clock signal, the first value P and second value Q being selected such that the second delta amount is smaller than the first delta amount.

18. A Global Navigation Satellite System, GNSS, receiver comprising a system according to claim 11.

19. The GNSS receiver of claim 18 further comprising at least one register adapted to store alignment information relating to the phase-alignment determined by the determination unit, and wherein the GNSS receiver is adapted to generate a timing signal based on alignment information stored by the at least one register.

20. A computer program embodied on a non-transitory computer readable medium and comprising computer program code means adapted to perform all the steps of claim 1 when said program is run on a computer.

* * * * *